(12) United States Patent
Chiang et al.

(10) Patent No.: US 6,241,597 B1
(45) Date of Patent: Jun. 5, 2001

(54) CLEANING APPARATUS FOR MAINTAINING SEMICONDUCTOR EQUIPMENT

(75) Inventors: Wen-Peng Chiang; Wen-Pin Hsieh, both of Hsin-Chu (TW)

(73) Assignee: Mosel Vitelic Inc., Hsin-Chu (TW)

( * ) Notice: Subject to any disclaimer, the term of this patent is extended or adjusted under 35 U.S.C. 154(b) by 0 days.

(21) Appl. No.: 09/265,056

(22) Filed: Mar. 9, 1999

(51) Int. Cl.⁷ .................................................. B05C 15/00
(52) U.S. Cl. ................................................ 454/49; 454/56
(58) Field of Search ........................ 454/49, 56; 266/157, 266/158, 144; 134/902, 102.3; 34/80, 92

(56) References Cited

U.S. PATENT DOCUMENTS

| | | | |
|---|---|---|---|
| 5,188,136 | * | 2/1993 | Kumagai .............................. 134/902 |
| 5,190,064 | * | 3/1993 | Aigo ..................................... 134/902 |
| 5,423,129 | * | 6/1995 | Castle et al. ............................. 34/80 |

* cited by examiner

Primary Examiner—Denise L. Ferensic
Assistant Examiner—Jiping Lu
(74) Attorney, Agent, or Firm—Harness, Dickey & Pierce, P.L.C.

(57) ABSTRACT

An apparatus for maintaining semiconductor is disclosed. The cleaning apparatus includes two parts of a maintaining apparatus and gas-absorbing apparatus The maintaining apparatus mainly comprises a container using for isolating poison gas outside and a inner vessel, both being shaped as a cylinder, having an absorption exit with hose extending. There are an entrance and an exit end for absorption exit of container as well. This absorption exit is formed as for receiving and passing toxic gas. The vessel is as like cylinder shape and which has a hole on the top, also a plurality of holes embodied on the vessel for gas exiting. A disk is provided for covering the vessel container, and also for isolating toxic gas and the natural atmosphere. A plurality of rollers is for providing both functions of loading and rotation of vessel. The gas-absorbing apparatus can provide a source for absorbing gas quickly as well.

8 Claims, 4 Drawing Sheets

CLEANING APPARATUS FOR MAINTAINING SEMICONDUCTOR EQUIPMENT

BACKGROUND OF THE INVENTION

1. Field of the Invention

The present invention relates to an apparatus used in maintaining a semiconductor factory, and, more particularly, to a cleaning apparatus for the semiconductor fabrication equipment

2. Description of the Prior Art

In the semiconductor factory, normally toxic gas is frequently used for the semiconductor fabrication process. Generally these toxic gases include $F_2$, $O_3$, $Br_2$, HCl, HCN, and HF gas, etc. According to practical experience, the retained toxic gas will still adhere to the manufacturing machine and related equipment even though the whole fabrication process is totally completed. This makes the manufacturing machine and related equipment compulsorily polluted, it is necessary to fully clean and maintain these related machines and equipment.

However, these cleaning jobs have always depended on working or operating by human operators, Also the retained toxic gas will evaporate again and could damage human health.

For example, chemical hydrogen chloride (HCl) could be produced by the above step when the retained gas such as chloride ($Cl_2$) gas reacts with water ($H_2O$) if cleaners directly wash the chamber of mechanical equipment by water only. The unfortunate operators will have to risk this dangerous, heavy and unhappy duty in the semiconductor factory. Otherwise the next coming process cannot be continuously run.

Therefore according to the above statement, it is apparently necessary to have special protection apparatus in order to exactly defend against injury from toxic gas, in the past, generally the cleaning work for mechanical equipment was operated by water only. Naturally toxic gas, such as hydrogen chloride (HCl) was produced according to the chemical reaction of hydrogen and chloride gas. The problem of how to avoid this sort of chemical reaction from happening or how to avoid damage to human health is concentrated by the practical engineer.

Many years ago, there was no better protection-related way in the industry. As shown in FIG. 1A. mechanical equipment was washed by a human gloved hand only, Meanwhile, the toxic gases are discharged out by a filter of chemical exhaust 51. However, the gas also will directly damage human's health before it is removed by the chemical exhaust. This is due to the fact that there is no more protection when the retained toxic gas move away from the surface of equipment to the filter of chemical exhaustion 51.

Hence, no doubt, a new apparatus or method should be certainly expected for many of the operators working at the semiconductor factory and their related manufacturing facility. All of them indeed want protection for themselves. A much more standard safety quality for maintaining semiconductor is required.

SUMMARY OF THE INVENTION

In accordance with the present invention, a method is provided for forming a cleaning apparatus that substantially cleans the semiconductor-related equipment, in one embodiment, as illustrated in FIG. 1B, an apparatus is installed in a practical semiconductor factory.

According to the apparatus for maintaining semiconductor equipment, the apparatus mainly comprises a cylinder-like container, a cylinder-like vessel, a disk-like cover and absorption-related apparatus including a vacuum cleaning, a local scrubber and a vacuum hose.

Another approach for absorbing a gas is as follows: Gas is normally introduced under pressure into a high-vacuum cleaner, such as pump, then gas will go to a local scrubber by vacuum hose for sequential removal, into a natural atmosphere. Gas will firstly be directed through the sidewall of a vessel. Secondly, at the end of the vessel, gas is discharged out. Then gas is absorbed at the end of the container. The next following step, the gas from the container is blown out the other end of the container as well as being sucked into the vacuum cleaner, Finally gas is removed to the natural atmosphere through a vacuum hose then by the local scrubber.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

Also in the main legend are shown the following:

11 Container
12 Absorption Exit
13 Vessel
14 Cover Disk
15 A Plurality of Holes
16 Roller
17 Trench-Track
18 Dust-Free Texture
21 Vacuum Hose
22 High-Vacuum Cleaner
23 Local Scrubber
31 Maintaining Apparatus
32 Gas-Absorbing Apparatus
51 Filter of Chemical Exhaustion

DESCRIPTION OF THE PREFERRED EMBODIMENT

Figure 1A:
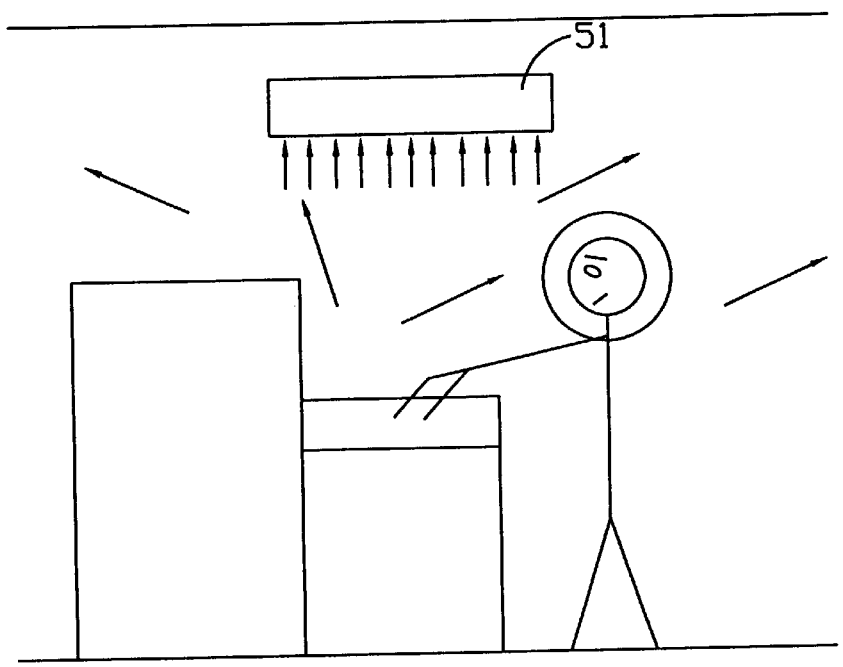
FIG. 1A is an embodiment illustrating the operation of the previous cleaning apparatus.
Figure 1B:
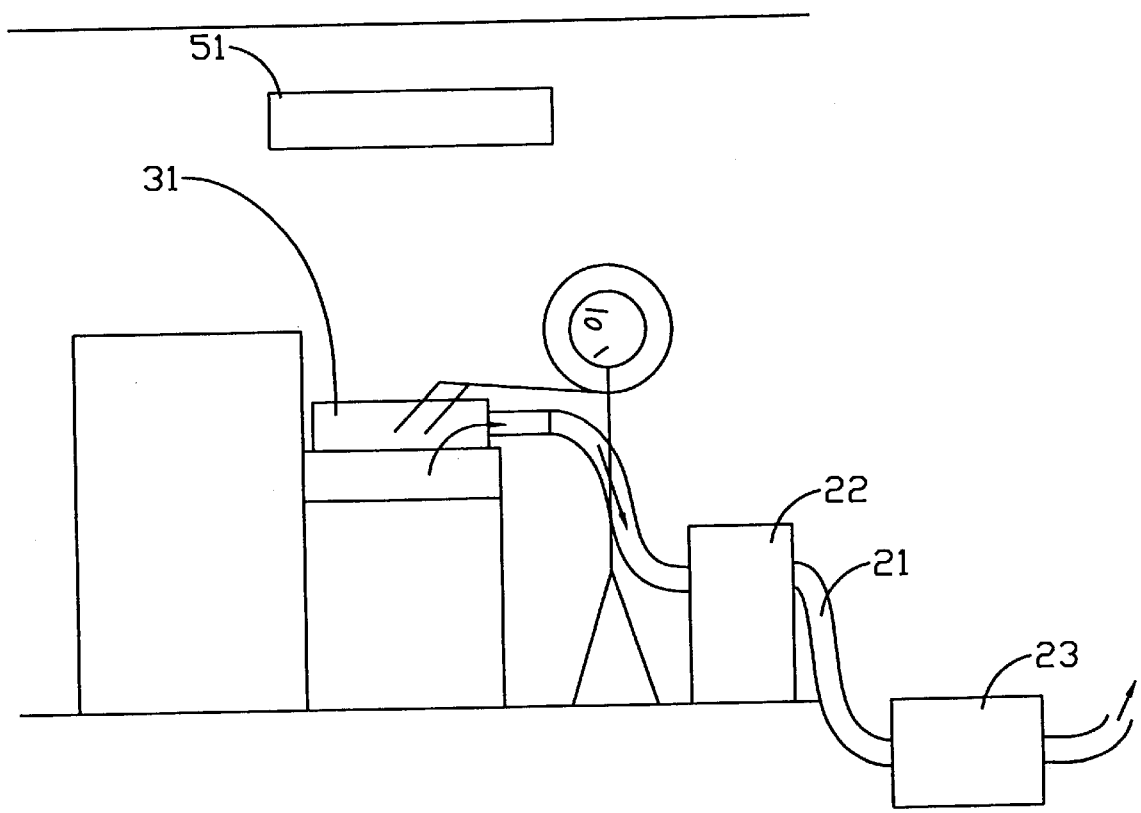
FIG. 1B is an embodiment illustrating the present invention for a cleaning apparatus operation.
Figure 2A:
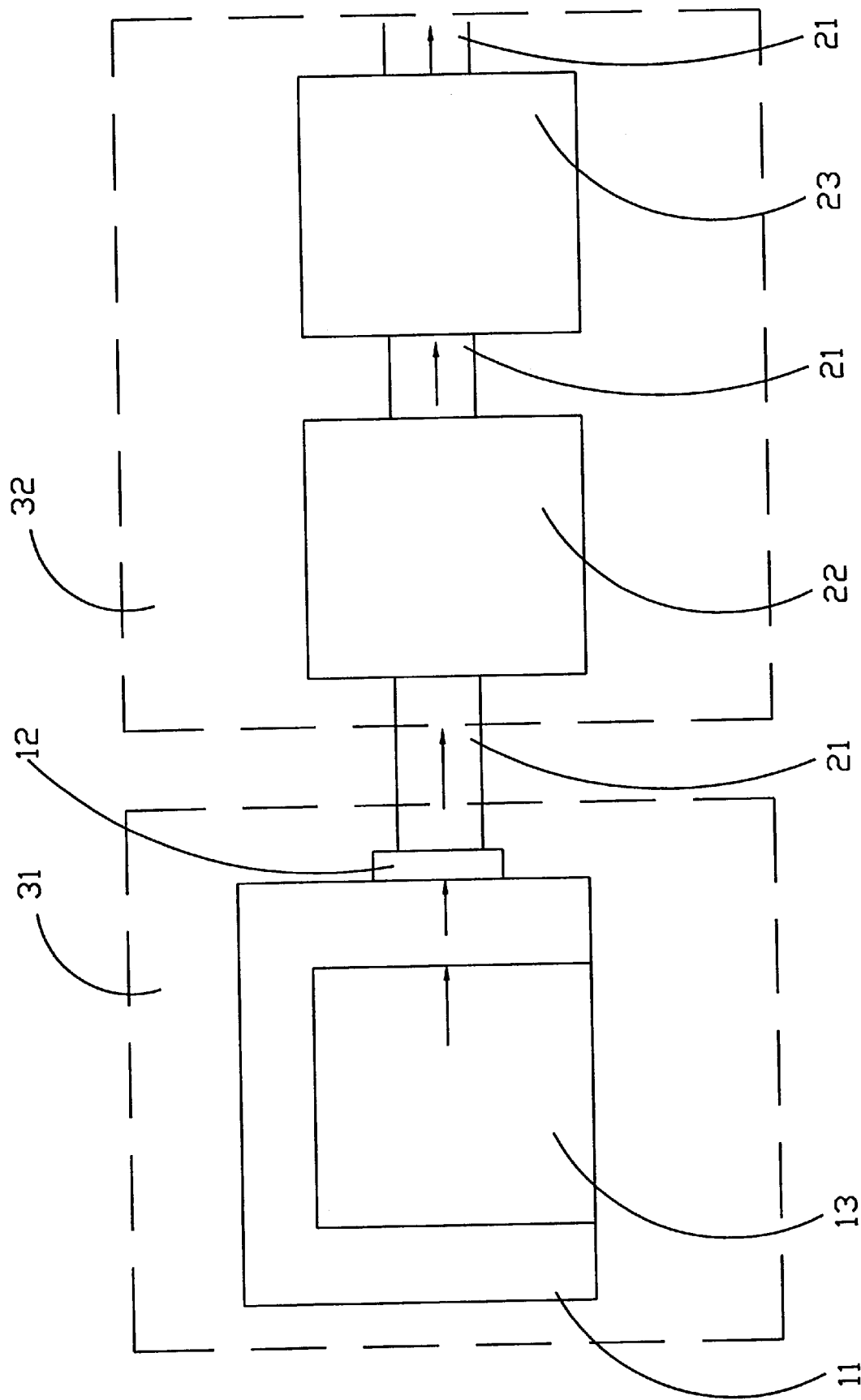
FIG. 2A is a flow charge demonstrating the absorption of toxic gas according to the present invention.

In one preferred embodiment, such as illustrated in FIG. 2A, a maintaining apparatus 31 and a gas-absorbing apparatus 32 are the main parts of the present Invention. However, the maintaining apparatus is apparently the main part for the present invention. Gas-absorbing apparatus is close to be defined as peripheral equipment for this cleaning apparatus. The details will be described according to the following steps.

The apparatus for absorbing toxic gas process is described as follows. Toxic gas is normally under pressure into a high-vacuum cleaner 22. such as through operation of a pump, then toxic gas will go to a local scrubber 23 by vacuum hose 21. At the above two steps, toxic gas is filtered as cleaned gas. Sequentially, the cleaned gas is removed into the natural atmosphere quickly.

When toxic gas absorbed at end of the vessel 13, the gas is then discharged out the other end of container 11. Therefore the gas from the vessel 13 and the container 11 is blown out the other end of container 11, and is also sucked quickly into the high-vacuum cleaner 22.

The maintaining apparatus consists of a like-cylinder container 11 with an absorption exit 12, a cylinder-like vessel 13, a cover disk 14. a plurality of holes 15 which appear on a cylinder-like vessel 13, a plurality of rollers 16, a trench-track 17, a dust-free texture 18 and a vacuum hose 21.

Figure 2B:
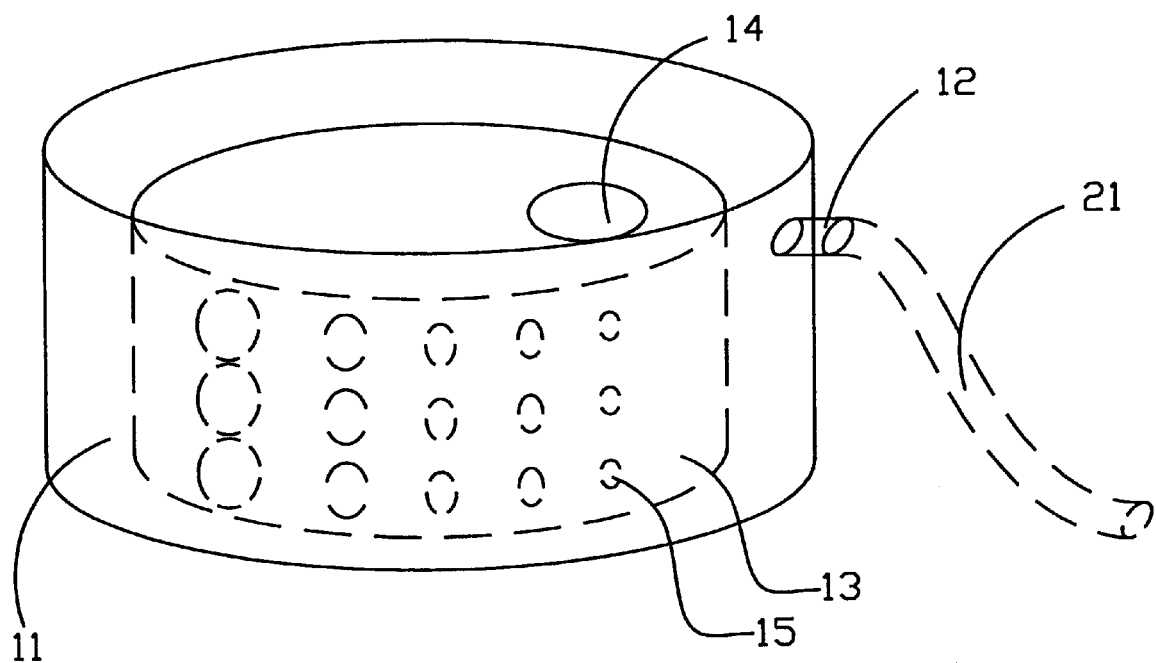
FIG. 2B is a three-dimensional diagram for maintaining the apparatus of the present invention.
Figure 2C:
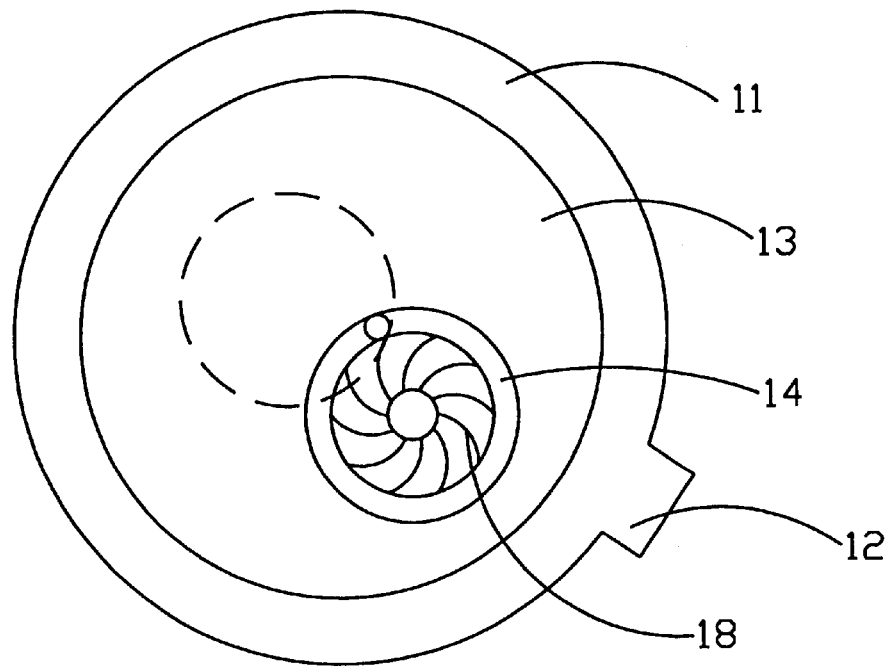
FIG. 2C is an upper side view of the maintaining apparatus of the present invention.

As illustrated as FIG. 2B, the maintaining apparatus consists of a container 11 having an absorbing exit 12 used for isolating toxic gas and removing toxic gas, which is fixed with inner vessel 13 and shaped as a cylinder. Meanwhile it is extended with an absorption that has an entrance and an exit end. Vacuum hose 21 is specially shaped for receiving and passing toxic gas. The vessel 13 has a cylinder shape with a plurality of holes 15. The holes 15 are embodied on the vessel 13 for gas existing. Cover disk 14 is for covering the vessel 13 only. High-vacuum cleaner 22 and local scrubber 23 both are normally for absorbing gas and filtering gas. Vacuum hose 21 extends from the absorbing apparatus including high-vacuum cleaner 22 and local scrubber 23 for passing toxic gas. Also it is terminated in the container 11 toward the exit. as well as another end of container 11 for discharging out whole toxic gas. It is noticed that there are rollers for rotating the inner vessel, as FIG. 2C. Rollers 16 are for rotating vessel 13 and loading the whole vessel. Normally rollers 16 are run along trench-track 17.

Finally toxic gas is discharged out from the end of container 11 quickly. In fact, that gas is placed adjacent to end in alignment. Then generally it is sucked into high-vacuum cleaner 22 and is blown out from the other end of container 11.

Figure 2D:
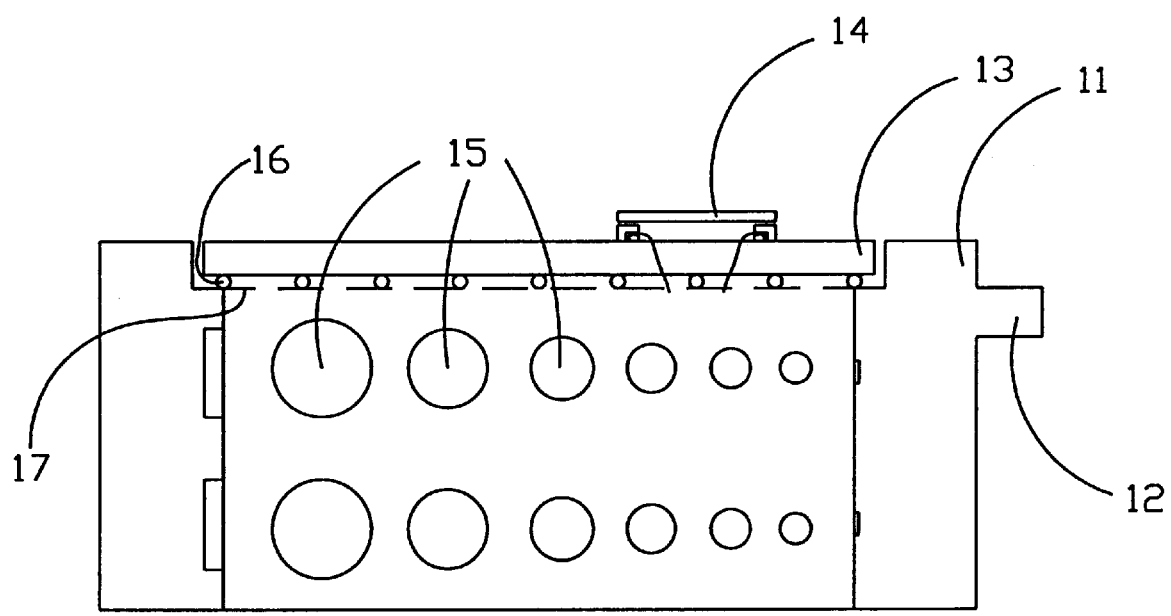
FIG. 2D is a cross-section view illustrating the maintaining apparatus of the present invention.

Holes 15 are porous-type which exist distributively on vessel 13, that size of porous hole 15 is gradient. The change of the hole size is gradually from big to small, or from small to big that is illustrated as FIG. 2D. FIG. 2D is a cross-section of the maintaining apparatus. Generally the gradient size is for regulating the flux of fluid toxic gas. Its function is to provide uniform flux of toxic gas at any place of vessel 13.

The function of container 11 is for isolating gas due to this containing being a gas barrier between the outer atmosphere and the inner toxic gas. Also, the vessel 13 is connected with a high-vacuum cleaner 22 by a vacuum hose 21. The cover disk 14 is ideally covered on the top of the vessel. The vessel 13 is firstly installed inside the container 11, sequentially the cover disk 14 is cased up on the top of the vessel 13.

While the cleaning apparatus is operated, rollers 16 are provided for loading and rotating the vessel 13. Normally the rollers 16 are run on a special trench-track 17. This arrangement fbrms a vessel recess, defined as a long and thin track. This trench-track 17 is established along the edge of the vessel.

Here, there is dust-free texture using for cover disk 14, also cover disk 14 is applied to cover the top hole of the vessel 13. Usually there is an opening wheel hole centered on this cover disk for a gloved hand or other cleaning apparatus. This dust-free texture material generally is made from an elastic texture or other sorts of flexible materials. This dust-free texture 18 can actually perform having a flexible property. Therefore, the dust-free texture will stick actively with gloved hand tightly when the gloved hand is inserted through the maintaining apparatus. It will fully isolate the toxic gas inside and atmosphere outside, respectively.

Basically, the gloved-hand or other cleaning texture is able to insert the maintaining apparatus, through the top hole of vessel 13. Meanwhile the gloved-hand or other cleaning texture can rotate and then easily clean the surface of related equipment when the maintaining apparatus is rotated.

As a cylinder-like maintaining apparatus, at the steps of cleaning onto the outer peripheral surface of the semiconductor equipment, while the vessel 13 is rotating, the cleaning apparatus can wipe off a contaminant on the outer peripheral surface of the semiconductor equipment. Particularly the portion of the gas-absorbing that has been utilized during the preceding cleaning operation, before the next cleaning operation is started, whereby the portion of the gas-absorbing apparatus is totally used again for the cleaning in the next cleaning operation.

Although specific embodiments have been illustrated and described, it will be obvious to those skilled in the art that various modifications may be made without departing from what is intended to be limited solely by the appended claims.

What is claimed is:

1. Maintenance apparatus for use in a chamber that performs a semiconductor process, said apparatus comprising:
    a chassis for containing the chamber, said chassis having an opening through which maintenance work is performed, and having an exit outlet;
    a vessel located in said chassis, wherein wall of said vessel having a plurality of holes, wherein said vessel includes:
        a first end configured to receive gas from the chamber, and
        a second end with an opening, which is approximately the same size as the opening of said chassis, and is coupled to the opening of said chassis; and
    a cover rotatably mounted on the opening of said vessel, said cover having an opening through which maintenance work is performed, wherein said exit outlet is configured to allow the gas from the interior of said vessel to flow through the plurality of holes of said vessel into space between said vessel and said chassis, and further flow out of said chassis through the exit outlet.

2. The apparatus according to claim 1, further comprising a cap mounted on the opening of said cover.

3. The apparatus according to claim 2, wherein said cap comprises a texture that prevents the gas from escaping outwards while permits the maintenance work into said vessel through said cap.

4. Maintenance apparatus for use in a chamber that performs a semiconductor process, said apparatus comprising:
    a chassis for containing the chamber, said chassis having an opening through which maintenance work is performed, and having an exit outlet coupled to a pump;
    a vessel located in said chassis, wherein wall of said vessel having a plurality of holes, wherein said vessel includes:

a first end configured to receive gas from the chamber, and a second end with an opening, which is approximately the same size as the opening of said chassis, and is coupled to the opening of said chassis, wherein the hole further from said exit outlet has a size greater than the hole close to said exit outlet so that the flow of the gas through each of the holes is about the same;

a cover rotatably mounted on the opening of said vessel, said cover having an opening through which maintenance work is performed; and a cap mounted on the opening of said cover, said cap having a texture that prevents the gas from escaping outwards while permits the maintenance work into said vessel through said cap, wherein the exit outlet is configured to allow the gas from the interior of said vessel to flow through the plurality of holes of said vessel into space between said vessel and said chassis, and further flow out of said chassis through the exit outlet.

5. The apparatus according to claim 4, further comprising a pump coupled to the exit outlet.

6. The apparatus according to claim 5, wherein said plurality of holes of the vessel are arranged so that the flow of the gas through each of the holes is about the same.

7. The apparatus according to claim 6, wherein the hole further from said exit outlet has a size greater than the hole close to said exit outlet.

8. The apparatus according to claim 4, wherein said texture comprises elastic material.

* * * * *